US005646814A

United States Patent [19]
Shamouilian et al.

[11] Patent Number: 5,646,814
[45] Date of Patent: Jul. 8, 1997

[54] MULTI-ELECTRODE ELECTROSTATIC CHUCK

[75] Inventors: Shamouil Shamouilian, San Jose; Samuel Broydo, Los Altos Hills; Manoocher Birang, Los Gatos, all of Calif.

[73] Assignee: Applied Materials, Inc., Santa Clara, Calif.

[21] Appl. No.: 276,010

[22] Filed: Jul. 15, 1994

[51] Int. Cl.$^6$ .................................................. H02N 13/00
[52] U.S. Cl. ........................................................... 361/234
[58] Field of Search ............................................. 361/234

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,771,730 | 9/1988 | Tezuka . |
| 5,155,652 | 10/1992 | Logan et al. ......................... 361/234 |

FOREIGN PATENT DOCUMENTS

| | | |
|---|---|---|
| 1-298721 | 12/1989 | Japan . |
| 2-27748 | 1/1990 | Japan . |

OTHER PUBLICATIONS

IBM Technical Disclosure Bulletin, vol. 32, No. 5B, Oct. 1989; Double Sided Electrostatic Chuck.

Klein, Allen J., "Curing Techniques for Composites," *Advanced Composites*, Mar./Apr. 1988, pp. 32–44.

"Data Sheet —Breathers and Bleeders," Data Sheet from Airtech International, Inc., Carson, California (1993).

"Kapton General Information," Technical Brochure from DuPont de Nemours Company, Wilmington, Delaware (1993).

"R/flex® 1100 High Temperature Materials," Data Sheet DS20903D, Rogers Corporation, Chandler, Arizona (1993).

U.S. Patent Application entitled, "Protective Coating for Dielectric Material on Wafer Support Used in Integrated Circuit Processing Apparatus and Method of Forming Same;" filed Apr. 22, 1993; Ser. No. 08/052,018; Inventors: Wu, et al.; Attorney Docket No. 428.

U.S. Patent Application entitled, "An Electrostatic Chuck Having a Grooved Surface"; filed Jul. 20, 1993; Ser. No. Inventor: Steger; Attorney Docket No. 260.

*Primary Examiner*—Fritz Fleming
*Attorney, Agent, or Firm*—Ashok Y. Janah; James C. Wilson

[57] ABSTRACT

A multi-electrode electrostatic chuck (20) for holding a substrate (42) such as a silicon wafer during processing is described. The electrostatic chuck (20) comprises (i) a first electrode (22), (ii) a second electrode (24), and (iii) an insulator (26) having a lower portion (26a), a middle portion (26b) and an upper portion (26c). The lower portion (26a) of the insulator (26) is below the first electrode (22) and has a bottom surface (28) suitable for resting the chuck (20) on a support (44) in a process chamber (41). The middle portion (26b) of the insulator (26) lies between the first and second electrodes (22), (24). The upper portion (26c) of the insulator (26) is on the second electrode (24), and has a top surface (30) suitable for holding a substrate (42). The first and second electrodes (22, 24) can have a unipolar or bipolar configurations. In operation, the chuck (20) is placed on a support (44) in a process chamber (41) so that the bottom surface (28) of the chuck (20) rests on the support (44). A substrate (42) is placed on the top surface (30) of the chuck (20). When the first electrode (22) of the chuck (20) is electrically biased with respect to the support (44), a first electrostatic force holds the chuck (20) onto the support (44). When the second electrode (24) of the chuck (20) is electrically biased with respect to the substrate (42) placed on the chuck (20), a second electrostatic force holds the substrate (42) to the chuck (20).

45 Claims, 3 Drawing Sheets

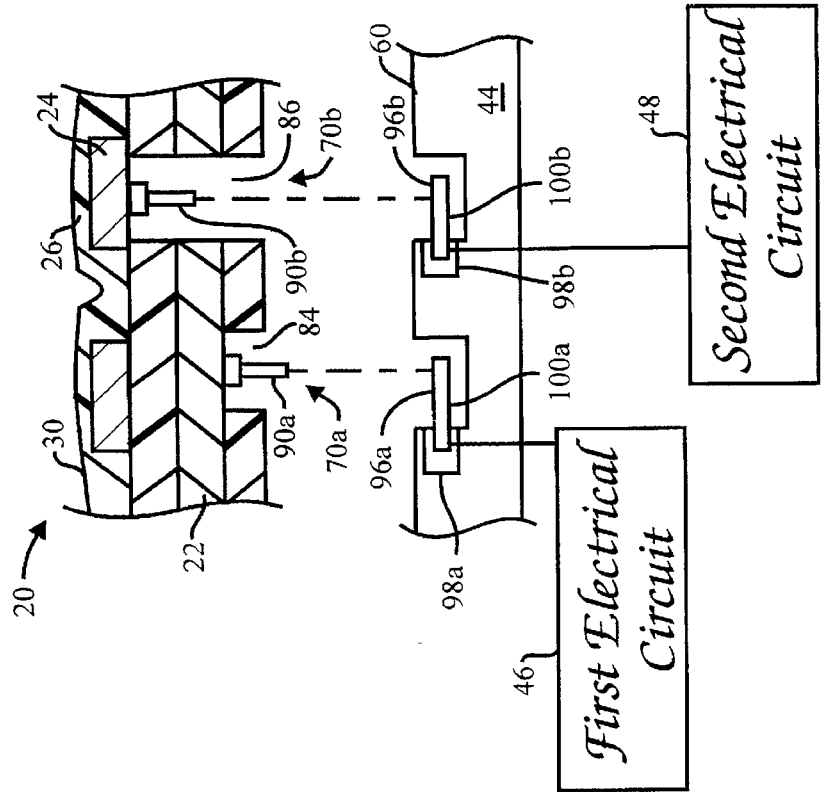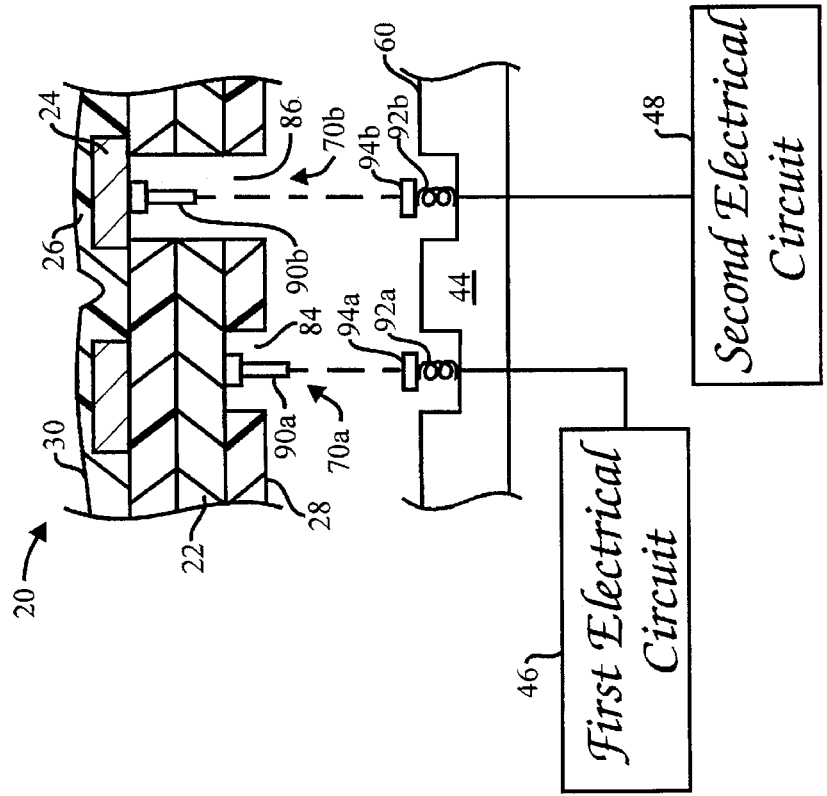

MULTI-ELECTRODE ELECTROSTATIC CHUCK

BACKGROUND

This invention relates to an electrostatic chuck for holding substrates, such as semiconductor wafers, during processing of the substrate.

In the semiconductor industry, electrostatic chucks are used to hold substrates on supports during processing of the substrate. A typical electrostatic chuck comprises a base, an electrically insulative layer on the base, and a single electrode embedded in the electrically insulative layer. During its use, the chuck is secured to a support in a process chamber, and a substrate is placed on the chuck. The electrode in the chuck is electrically biased with respect to the substrate by an electrical voltage source. Opposing electrostatic charge accumulates in the electrode of the chuck and in the substrate, the insulative layer precluding flow of charge therebetween. The electrostatic force resulting from the accumulation of electrostatic charge holds the substrate to the chuck during processing of the substrate.

Electrostatic chucks are generally described in, for example, U.S. Pat. No. 4,184,188, to Briglia; U.S. Pat. No. 4,399,016, to Tsukuda; U.S. Pat. No. 4,384,918, to Abe; U.S. patent application Ser. No. 08/189,562, entitled "Electrostatic Chuck" by Shamouilian, et al., filed on Jan. 31, 1994; and in "Electrostatic Force and Absorption Current of Alumina Electrostatic Chuck," by Watanabe, et al., Japanese Journal of Applied Physics, 31 (1992) pages 2145-2150—all of which are incorporated herein by reference.

Conventional methods to secure an electrostatic chuck to a support in a process chamber include the use of screws, clamps, and adhesive bonding layers. However, conventional securing methods have several disadvantages. First, screws and clamps do not allow for quick replacement of the chuck. Typically, electrostatic chucks require frequent replacement when used in corrosive processing environments, such as environments containing plasmas of oxygen, chlorine and fluorine, because the electrode and insulative layer on the chuck corrode in the corrosive environments. When the chuck is screwed or clamped onto the support, the chuck cannot be removed or replaced quickly.

Furthermore, the screws and clamps used to secure the chuck corrode in the corrosive environments, further hampering quick replacement of the chuck. The corroded components also form contaminant particulates which deposit upon and contaminate the substrate. Such contamination is often not discovered until the substrate is fully processed, and worth more than $50,000, resulting in lower yields and higher processing costs.

Another problem with the use of clamps or screws to secure the chuck to the support is that the clamps and screws often cause the chuck to non-uniformly contact the support due to the uneven pressure applied by the screws and clamps. Non-uniform contact at the chuck-support interface hinders the transfer of heat through the interface, causing the substrate on the chuck to become excessively hot, during processing of the substrate.

Thus, there is a need for a securing system or apparatus for holding a chuck to a support which allows for quick installation and removal of the chuck, good heat transfer between the chuck and the support, and which minimizes formation of corrosive contaminants which can deposit on the substrate.

SUMMARY

The electrostatic chuck of the present invention satisfies these needs. The electrostatic chuck comprises (a) first and second electrodes, and (b) an insulator having a lower portion, a middle portion and an upper portion. The lower portion of the insulator is below the first electrode, and has a bottom surface suitable for resting the chuck on a support in a process chamber. The middle portion of the insulator lies between the first and second electrodes. The upper portion of the insulator is on the second electrode, and has a top surface suitable for holding a substrate.

In operation, the electrostatic chuck is placed on a support in a process chamber so that the bottom surface of the chuck rests on the support. A substrate is placed on the top surface of the chuck. When a first voltage is applied to the first electrode, a first electrostatic force holds the chuck onto the support. When a second electrode voltage is applied to the second electrode, a second electrostatic force holds the substrate to the chuck.

Preferably at least one surface of the insulator, namely either the bottom surface or the top surface, or both surfaces, have spaced apart grooves therein. The grooves are sized and distributed for holding a coolant for cooling the substrate placed on the chuck.

Typically the substrate is disk shaped, and thus, typically the chuck has a right cylindrical shape. Typically, the first and second electrodes of the chuck are planar, and more typically disk shaped. The first and second electrodes can be unipolar electrodes or can be bipolar electrodes.

DRAWINGS

These and other features, aspects, and advantages of the present invention will become better understood with regard to the following description, appended claims, and accompanying drawings, where:

FIG. 4a is a partial cross-sectional, side elevation, schematic view of the chuck of FIG. 2;

FIG. 4b is a partially cross-sectional, side elevation, schematic view of another embodiment of the chuck of FIG. 2.

DESCRIPTION

Figure 1:
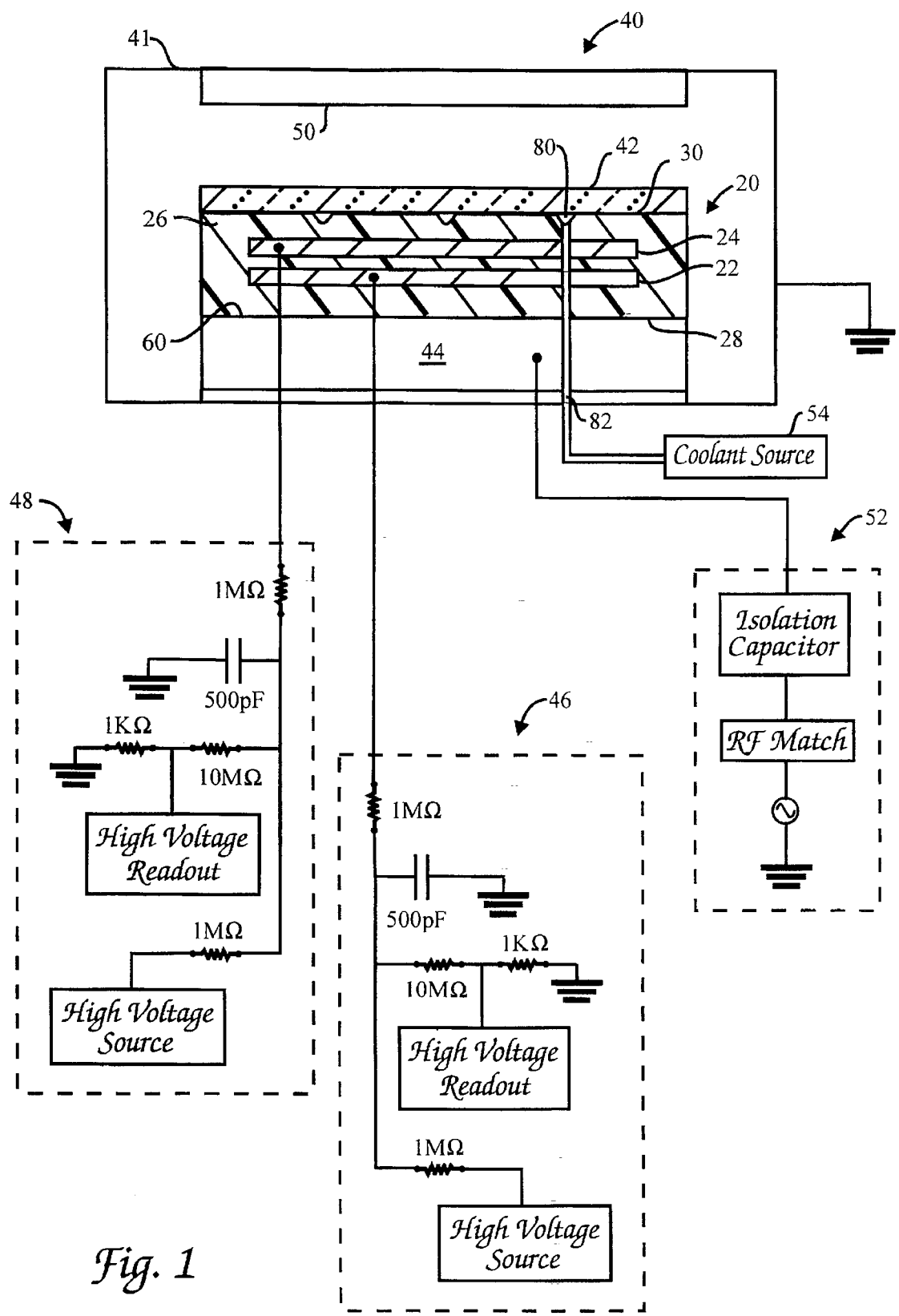
FIG. 1 is a side elevational schematic view, partly in cross-section, of a processing chamber containing an electrostatic chuck of the present invention.

With reference to FIG. 2, an electrostatic chuck 20, according to the present invention, generally comprises (i) a first electrode 22, (ii) a second electrode 24, and (iii) an insulator 26. The insulator 26 has a lower portion 26a below the first electrode 22, a middle portion 26b between the first and second electrodes 22, 24, and an upper portion 26c on the second electrode 24. The chuck 20 also has a bottom surface 28 and a top surface 30.

With reference to FIG. 1, operation of the chuck 20 of the present invention will now be described. The version of the chuck shown in FIG. 1, has a unipolar first electrode 22, however, the chuck can instead comprise a bipolar electrode 22a, 22b as shown in FIG. 2b, such as for example the bipolar electrode chucks disclosed in U.S. Pat. No. 4,184, 188 to Briglia; U.S. Pat. No. 4,384,918 to Abe; and Tsukada et al.,—all of which are incorporated herein by reference.

FIG. 1 shows a typical apparatus 40 comprising a process chamber 41, which can be used to process a substrate 42, such as a silicon wafer. The particular embodiment of the apparatus 40 shown herein is suitable for plasma processing of substrates 42, and is provided to illustrate operation of the chuck 20. The apparatus 40 should not be used to limit the scope of the invention. For example, the chuck 20 can also be used in other processing apparatus, such as non-plasma systems.

The apparatus 40 generally comprises (i) a support 44, (ii) an electrostatic chuck 20 according to the present invention, (iii) an external first electrical circuit 46, and (iv) an external second electrical circuit 48. Optionally, when the apparatus 40 is used for plasma processing of the substrate 42, the process chamber 41 also comprises an electrically grounded surface 50. A third electrical circuit 52 supplies RF power to the support 44, for forming a plasma between the support 44 and the electrically grounded surface 50. In addition, a fourth electrical circuit (not shown) can be used to supply a DC voltage to the support 44 to the bias the support 44 with respect to the first electrode 22 as described below. When it is necessary to remove heat from the substrate 42 to maintain the substrate 42 at a constant temperature, a coolant source 54 is used.

The support 44 in the process chamber 41 typically comprises an electrically conductive portion, which can function as a process electrode for plasma processing in the apparatus 40. Typically, the electrically conductive portion of the support 44 is made from an electrically conductive metal, such as for example, aluminum, copper, nickel, chromium, iron and alloys thereof. The support 44 has an upper surface 60 sized and shaped to hold the electrostatic chuck 20. The upper surface 60 can be substantially flat, or can have grooves therein (not shown), the grooves spaced apart and sized to hold coolant for cooling the chuck 20.

As shown in FIGS. 4a and 4b, the first and second electrodes 22, 24 in the chuck 20 are electrically connected to the first and second electrical circuits 46, 48, respectively. A first connector 70a electrically connects the first electrode 22 of the chuck 20 to the first electrical circuit 46, and a second connector 70b electrically connects the second electrode 24 to the second electrical circuit 48. The first and second electrical circuits 46, 48 serve as voltage sources for providing an electrical voltage to the first and second electrodes 22, 24 of the chuck 20.

To process the substrate 42, the chuck 20 is placed on the support 44, so that the bottom surface 28 of the chuck 20 contacts the upper surface 60 of the support 44, and a substrate 42 is placed on the top surface 30 of the chuck 20. Process gas is introduced into the process chamber of the apparatus 40, and a plasma is generated from the process gas.

To secure the chuck 20 to the support 44, the first electrical circuit 46 and the third electrical circuit 52 are activated. The electrical voltage applied by the first electrical circuit 46 to the first electrode 22 works in conjunction with the electrical voltage applied by the third electrical circuit 52 and optionally the fourth circuit (not shown) to the support 44, to cause opposing electrostatic charge to accumulate in the first electrode 22 and in the support 44, adjacent to the insulative layer 26a therebetween. The opposing electrostatic charge results in an attractive electrostatic force that secures the chuck 20 to the support 44. The electrostatic securing system is advantageous because it allows quick replacement of the chuck 20, merely by deactivating the electrical circuits. Also, the chuck limits corrosion contamination of the substrate, because it does not have components such as screws and clamps which corrode on exposure to plasma.

The substrate 42 is secured to the chuck 20 by activating the second electrical circuit 48. The third electrical circuit 52 electrically biases the support 44 with respect to the electrically grounded surface 50 of the apparatus 40, so that charged plasma species are attracted toward, and impinge upon, the substrate 42. The charged species impinging on the substrate 42 work in conjunction with the electrical voltage applied to the second electrode 24, to cause opposing electrostatic charge to accumulate in the substrate 42 and in the second electrode 24, adjacent to the insulative layer 26c therebetween. The opposing electrostatic charge results in an electrostatic force that holds the substrate 42 to the chuck 20. In this manner, the substrate 42 is electrically biased with respect to the second electrode 24, without grounding the substrate 42.

The first and second electrical circuits 46, 48 vary according to the size of the chuck 20, the electrodes 22, 24, and the substrate 42. These circuits can vary as long as a sufficient electrical voltage is applied to the first electrode 22 and the second electrode 24, to hold the chuck 20 to the cathode 14, and to hold the substrate 42 to the chuck 20, respectively. A suitable first and second electrical circuit 46, 48 comprises a high voltage DC source, i.e., 1000 to 3000 volts, connected to a high voltage readout, through a 10 M Ω resistor. The one M Ω resistor in the circuit limits the current flowing though the circuit, and a 500 pF capacitor is provided as an alternating current filter.

The third voltage source 52 is conventional and generally comprises an RF impedance that matches impedance of the apparatus 40 to the impedance of the line voltage, in series with an isolation capacitor, as shown in FIG. 1. A fourth voltage source (not shown) can be used to supply a DC voltage to the support 44 to bias the support 44 with respect to the first electrode 22 in the chuck 20. The fourth voltage source is typically a conventional DC voltage source.

When either of the electrodes 22, 24 comprise a bipolar electrode structure, comprising a pair of electrodes, as shown in FIG. 2b, voltages are applied to each electrode of the pair of electrodes, so that the pair of electrodes are maintained at opposite polarities. The bipolar electrode configurations allows accumulation of electrostatic charge in the substrate 42, or in the support 44, without electrically biasing the substrate or support. A bipolar first electrode 22a, 22b as shown in FIG. 2b can be used to hold the chuck to the support 44 without applying a voltage to the support 44 for biasing the support. A bipolar electrode configuration can also be advantageous for the second electrode 24 when the chuck is used for non-plasma processes, where there are no charged plasmas species that serve as charge carriers for electrically biasing the substrate 42.

To remove and replace the chuck 20, the first and second electrical circuits are deactivated, the substrate 42 is removed from the chuck 20, and once the circuits are deactivated, the chuck 20 is removed from the process chamber 41, without requiring removal or loosening of any screws or clamps.

Chuck

Particular aspects of the chuck 20 will now be discussed in detail. Generally, the chuck 20 has a shape and size corresponding to the shape and size of the substrate 42 to maximize the heat transfer surface between the chuck 20 and the substrate 42, and to provide a wide surface for holding the substrate 42. For example, if the substrate 42 is disk shaped, a right cylindrical shaped chuck 20 is preferred. Typically, the right cylindrical chuck 20 has a diameter of from about 100 mm to about 300 mm, to match the diameter of the substrate which is typically from about 127 mm to 203 mm (5 to 8 inches). Typically, the chuck is about 1.475 to 1.725 mm in height. Alternatively, the chuck 20 can have a shape different from the shape of the substrate 42 or a size different from the size of the substrate 42.

As previously discussed, the chuck 20 comprises (i) a first electrode 22, (ii) a second electrode 24, and (iii) an insulator 26. Each of these portions of the chuck 20 are described below.

Electrodes

The size and shape of the first and second electrodes 22, 24 of the chuck 20, vary according to the size and shape of the chuck 20 and the substrate 42. For example, as shown in the drawings, if the chuck 20 is cylindrical shaped, the first and second electrodes 22, 24 can be generally disk shaped to maximize the area of the electrodes in contact with the support 44 and the substrate 42, respectively. The first and second electrodes 22, 24 can be formed as a unitary planar conductive element, which is continuous, or patterned into features, as shown for the first electrode 22 of FIGS. 2 and 3. When the electrodes 22, 24 comprise a pattern of features, the features form grooves therebetween which are capable of holding coolant to cool the substrate 42.

Either of the first and second electrodes 22, 24 can comprise a bipolar electrode structure comprising a pair of electrodes as shown in FIG. 2b. Conventional bipolar electrode 22a, 22b configurations are suitable, such as for example, the bipolar configurations disclosed in U.S. Pat. No. 4,184,188 to Briglia; U.S. Pat. No. 4,384,918 to Abe; and Tsukada et al., all of which are incorporated herein by reference. Typically, each electrode of the bipolar configuration, such as the electrode 22a, 22b is connected to a separate voltage from that of the other electrode, so that the pair of electrodes can be maintained at opposing polarity. Typically, the bipolar electrode structures 22a, 22b form a unitary planar conductive element. Typically, the area of each of the pair of electrodes 22a, 22b is substantially equivalent, so that equivalent opposing charges accumulate in the underlying support 44.

The first and second electrodes 22, 24 are each made from an electrically conductive metal, such as for example, copper, nickel, chromium, aluminum, iron, and alloys thereof. Typically, the thickness of the first electrode 22 is from about 1 µm to about 100 µm. Optionally, when the first electrode functions as a base member for supporting the insulator 26 and the second electrode 24 thereon, the first electrode 22 has a thickness of from about 50 µm to about 100 µm. Typically, the thickness of the second electrode 24 is from about 1 µm to 100 µm, and more typically from about 1 µm to 30 µm.

Insulator

The insulator 26 of the chuck 20 typically comprises (i) a lower portion 26a having a bottom surface 28, (ii) a middle portion 26b that separates the electrodes 22 and 24, and (iii) an upper portion 26c on the second electrode 24 having a top surface 30. Preferably, the insulator 26 is a continuous insulator that continuously extends around the electrodes 22, 24 to embed the electrodes therein. More preferably, the insulator 26 does not include electrically grounded elements that are electrically grounded during operation of the chuck 20, and which would result in electrical grounding of the polarized electrodes 22, 24.

Preferably, the top surface 30 of the insulator 26 has spaced apart grooves 80 therein, the grooves 80 sized and distributed to hold coolant from a coolant source 54 for cooling the substrate 42. The grooves 80 can form a pattern of intersecting channels, the channels lying between the features of the second electrode 24. Alternative groove patterns are described in "Electrostatic Chuck" by Shamouilian, et al., as referenced above. Optionally, the bottom surface 28 of the insulator 26 can also have spaced apart grooves (not shown) therein, for holding coolant for cooling the chuck 20.

The overall thickness of the insulator 26, and the thickness of each portion 26a, 26b, and 26c of the insulator 26, vary according to the electrical resistivity and dielectric constant of the insulative material used to form the insulator 26. As the resistivity of the insulative material increases, the required thicknesses proportionately decrease. Typically, the insulative material has a resistivity ranging from about $10^{13}$ $\Omega$ cm to $10^{20}$ $\Omega$ cm, and a dielectric constant of at least about 2, and more preferably at least about 3. When the insulative material has a dielectric constant of about 3.5, a suitable thickness for each portion 26a, 26b, and 26c is from about 1 µm to about 100 µm, and more typically from about 25 µm to about 100 µm.

Preferably, the insulative material is resistant to temperatures in excess of 50° C., and more preferably resistant to temperatures in excess of 100° C., so that the chuck 28 can be used in processes where the substrate 42 is heated. The dielectric breakdown strength of the insulative material should be high as possible to prevent the flow of electrons through the insulative material. Typically, when a polyimide is used as the insulative material, the insulative material has a dielectric breakdown strength of at least about 100 volts/mil (3.9 volts/micron), and more typically at least about 1000 volts/mil (39 volts/micron).

Optimally, the insulative material has a high thermal conductivity so that heat generated in the substrate 42 during processing can dissipate through the chuck 20. The thermal conductivity of the insulator 26 should be at least about 0.1 Watts/m/°K, to allow sufficient heat transfer to preclude overheating of the substrate 42.

Suitable insulative materials for the insulator include synthetic polymer materials such as polyimides, polyketones, polyetherketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone, and rubber.

The insulative material can also include filler materials for increasing the thermal conductivity and/or resistance to corrosion. Fillers such as diamond, alumina, zirconium boride, boron nitride, and aluminum nitride are preferred because these materials have high thermal conductivity, good insulative properties, and can withstand high temperatures. Preferably the filler material is a powder with an average particle size of less than about 10 µm, and preferably, the filler is dispersed in the insulative material in a volumetric ratio from about 10% to 80%, and more typically from about 20% to 50%.

Additionally, a protective coating (not shown) can be applied on the top surface 30 of the insulator 26 to protect the insulator 26 from chemical degradation when the chuck 20 is used in corrosive processing environments. Preferred protective coatings and processes for their fabrication are described in more detail in for example U.S. patent application Ser. No. 08/052,018, filed on Feb. 22, 1993, entitled "PROTECTIVE COATING FOR DIELECTRIC MATERIAL ON WAFER SUPPORT USED IN INTEGRATED CIRCUIT PROCESSING APPARATUS AND METHOD OF FORMING THE SAME," by Wu, et al., which is incorporated herein by reference.

Connectors

The chuck 20 also comprises first and second connectors 70a, 70b for connecting the second electrodes 22, 24 to the first and second voltage sources 46, 48, respectively. The first and second connectors 70a, 70b can comprise any conventional electrical connection device. For example, the first and second connectors 70a, 70b can comprise electrically conductive wire.

Preferably, the first and second connectors 70a, 70b are disengageable to allow for quick installation and replacement of the chuck 20. Preferred configurations of disengageable connectors extend through the holes 84, 86, in the chuck 20, as shown in FIGS. 4a and 4b. In these configurations, the connectors 70a, 70b comprise rigid conductive members 90a, 90b adhered to and extending downwardly from the first and second electrodes 22, 24. A pair of resilient conductive members 92a, 92b are electrically connected to the first and second electrical circuits 46, 48 and are mounted on the support 44. The resilient members 92a, 92b are vertically aligned with the first connectors 70a, 70b, respectively. When the chuck is positioned on the support 44, the rigid conductive members 90a, 90b press against the resilient conductive members 92a, 92b, thereby electrically connecting the voltage sources 46, 48 to the electrodes 22, 24, respectively.

The rigid conductive members 90a, 90b typically comprise a stud or rod. The lengths of the rigid members 90a, 90b vary according to the thickness of the insulator 26 and the position of the lower electrode 24 in the insulator 26. Typically, the rigid members 90a, 90b are less than about 5 mm long and have a diameter of about 5 to 20 mm.

The resilient conductive members 92a, 92b can comprise any flexible conductive material configured in a shape suitable to serve as an electrical connector. The resilient members are preferably made from a resilient electrically conductive material which is resistant to corrosion in plasma processing environments. Suitable materials include metallic alloys, such as aluminum alloys, or phosphorous-bronze. For example, the resilient members 92a, 92b can compose micro-springs, as shown in FIG. 3a. When micro-springs are used, contact pads 94a, 94b are positioned on the micro-springs for securely electrically connecting the springs 92a, 92b to the rigid conductive members 90a, 90b. Typically, the springs are less than about 5 mm long and are attached to the support 44 with electrically conductive adhesive. The contact pads 94a, 94b are disks having thicknesses of about 1 to 5 mm, and diameters of about 10 mm, and are also adhered with electrically conductive adhesive to the springs.

An alternative configuration for the resilient conductive members 92a, 92b in the support 44, is shown in FIG. 4b. In this configuration, the conductive members 92a, 92b comprise flexible tabs 96a, 96b. The tabs have first fixed portions 98a, 98b mounted on the support 44 and second extended portions 100a, 100b adapted to securely electrically contact the rigid members 90a, 90b.

Process of Manufacture

A preferred process for making an electrostatic chuck 20 according to the present invention, is described below.

Figure 2A:
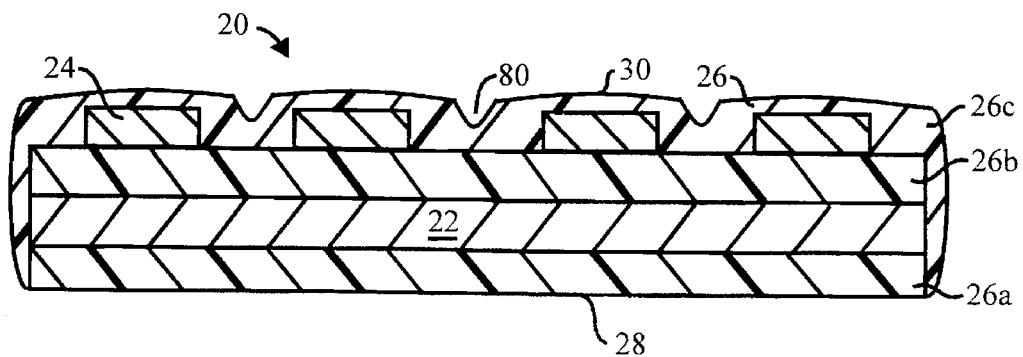
FIG. 2a is a cross-sectional side elevational schematic view of another version of the electrostatic chuck of the present invention.
Figure 2B:
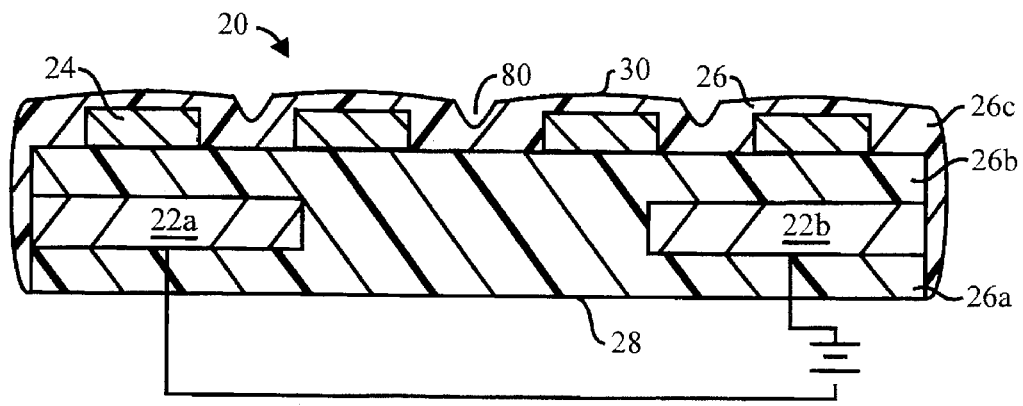
FIG. 2b is a cross-section side elevation schematic view of another version of the electrostatic chuck of the present invention showing bipolar electrodes in the insulator.

In the version of the chuck 20 shown in FIG. 2a and 2b, first electrode 22 is thicker than the second electrode 24 and serves as a base for the chuck 20. The first electrode 22 is made from an aluminum plate, cut into a right cylindrical shape with a thickness of about 50–100 mils (1.2–2.5 mm) and a diameter of between 5–8 inches (127–203 mm). The bottom and top surfaces 28, 30 of the aluminum plate are ground using conventional aluminum grinding techniques, until the surface roughness of the plate is less than about 1 µm. Surface grinding of the plate is essential for the bottom and top surfaces 28, 30 of the plate to uniformly contact the support 44, and the substrate 42, respectively. This allows efficient thermal transfer between the substrate 42, the chuck 20, and the support 44. After grinding, the plate is thoroughly cleaned to remove grinding debris.

The lower and middle portions 26a, 26b of the insulator 26 are formed by coating an insulative material on either side of the first electrode 22. A suitable insulative material is "PYRALIN," a polyimide commercially available from DuPont de Nemours Electronics Co., Wilmington, Del. The insulative material can be coated on the electrode 24 using a spin coating, dip coating, spraying, painting, or pressure forming processes as disclosed in U.S. patent application Ser. No. 08/381,786, filed on Jan. 31, 1995, entitled "Electrostatic Chuck," by Shamouilian, et al., as referenced above. Preferably, the insulative material is spin coated onto one side of the electrode 24 and cured by heating to a temperature of 400° C., and the process repeated for the other side of the electrode 24. When the insulative material comprises polyimide, the polyimide is coated to a thickness of about 50 microns on either side of the electrode 24.

The patterned upper electrode 26 is formed over the insulative layer 26b. The second electrode 24 can be formed by many different techniques, including for example, electroplating, chemical vapor deposition, and physical vapor deposition methods. A preferred method of forming the electrode layer comprises a multi-step electroplating process which includes the steps of: (i) sputter depositing a layer of "seed" chromium onto the insulative layer 26b, (ii) coating the sputtered chromium with a patterned layer of resist, (iii) patterning the resist layer, and (iv) electroplating a metal such as copper onto the portions of the chromium seed layer which are not coated by resist. The multi-step electroplating process is described below.

In the first step of the electroplating process, a chromium layer is sputtered over the insulative layer 26b to provide a "seed" layer for nucleating growth of subsequently deposited electroplated layer. The chromium layer is typically sputtered to a thickness of about 100–200 microns. Conventional chromium sputtering techniques are suitable, such as for example, those generally disclosed in U.S. Pat. No. 4,131,530; U.S. Pat. No. 4,022,947; U.S. Pat. No. 4,392,992; and J. A. Thorton, "Sputter Deposition Onto Plastics," Proceedings 18th American Conference of Society of Vacuum Coaters, Key Biscayne, Fla., April 7–9 (1975), pages 8–26.

Figure 3:
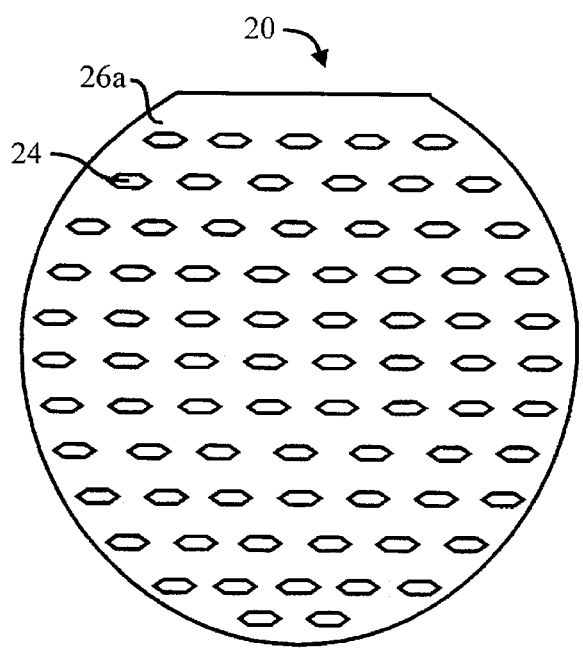
FIG. 3 is a top plan view of the top surface of the chuck of FIG. 2.

In the next step, a resist layer, such as "RISTON" photoresist fabricated by DuPont de Nemours Chemical Co., Wilmington, Del., is applied over the chromium "seed" layer. Photolithographic methods, such as those described in U.S. Pat. No. 4,952,528, to Abe, et al; U.S. Pat. No. 5,079,600, to Schnur, et al; and U.S. Pat. No. 5,221,422, to Das, et al.—all of which are incorporated herein by reference—are used to pattern the photoresist layer into a pattern corresponding to the desired configuration for the second electrode 24. A preferred second electrode 24 pattern is shown in FIG. 3. The patterned resist layer prevents the deposition of electroplated metal on the resist coated portions, during the electroplating step.

In the electroplating step, the resist-coated layer is electroplated to form a patterned second electrode 24 between the resist-coated portions. Preferably, the electrode 24 comprises copper formed by electroplating copper to a thickness of about 10 microns. Conventional copper plating techniques are suitable, such as those disclosed in U.S. Pat. No. 5,252,196, to Sonnenberg, et al.; U.S. Pat. No. 5,004,525, to Bernards, et al.; U.S. Pat. No. 4,898,647, to Luce, et al.; and U.S. Pat. No. 4,948,474, to Miljkovic, which are incorporated herein by reference.

After forming the patterned second electrode 24 on the chuck 20, remnant resist and chromium are etched from the chuck 20. Remnant resist is removed by wet chemical etching or plasma etching methods. A suitable wet chemical etching method comprises immersing the chuck 20 into a solution of N-methylpyrolidone heated to 80° C. for about ten minutes. Alternatively, a plasma etching techniques, such as those utilizing an oxygen plasma, as generally disclosed in U.S. Pat. No. 3,837,856, to Irving, et al.; U.S. Pat. No. 4,786,578, to Neisius, et al.; and U.S. Pat. No. 4,938,839, to Fujimura, et al.—all of which are incorporated herein by reference—can also be used to etch the remnant resist. After removal of the remnant resist, residual chromium is removed by a wet chemical etching step, such as by immersing the chuck 20 in a solution of sodium persulfate, followed by immersion in a solution of potassium permanganate.

An alternative method of forming a patterned upper electrode 24 comprises the steps of: (i) depositing a continuous layer of metal on the insulative layer 26a, 26b, 26c using any suitable metal deposition technique, including electroplating, and chemical and physical vapor deposition techniques as disclosed above; (ii) forming a patterned resist layer on the continuous metal layer, using conventional resist patterning techniques recited above; and (iii) etching the portions of the metal layer that are exposed between the resist coated portions, by a wet chemical or reactive ion etching process. Suitable metal etching processes for forming the patterned second electrode 24 are generally described in U.S. Pat. No. 3,615,951, to Franco, et al.; U.S. Pat. No. 5,100,499, to Douglas; U.S. Pat. No. 5,167,748, to Hall, et al.; U.S. Pat. No. 5,185,058, to Cathey; U.S. Pat. No. 5,200,032, to Shinohara; U.S. Pat. No. 5,215,619, to Cheng, et al.; and U.S. Pat. No. 5,221,430, to Kadomura, et al.—all of which are incorporated herein by reference. After etching, remnant resist on the chuck 20 is removed using the wet chemical or dry etching methods described above.

The upper portion 26c of the insulator 26 is then formed on the second electrode 24 by spin coating polyimide over the second electrode 24 to form a layer of polyimide enveloping the second electrode 24 and the sides of the chuck 20, as shown in FIG. 2. The viscous polyimide flows into the channels between the features of the second electrode 24, forming the grooves 80 on the top surface 30 of the chuck 20. The grooves 80 are typically several microns deep, being sufficiently deep to hold a coolant for cooling the substrate 42 on the chuck 20. The polyimide coating is cured by heating the polyimide to 400° C. A suitable thickness for the insulative layer 26a enclosing the second electrode 24 is about 50 microns.

Alternatively, when the second electrode 24 has a flat disk shape, such as that of the version of the chuck 20 shown in FIG. 1, the grooves 80 in the polyimide layer 26c can be formed by (i) forming a patterned resist layer on the insulative layer 26a, using the conventional resist patterning techniques described above, and (ii) etching grooves 80 in the resist coated insulative layer 26c using a plasma etching process. Suitable plasma etching processes are generally disclosed in, for example, U.S. Pat. No. 5,215,619, to Cheng, et al., and U.S. Pat. No. 4,574,177, to Wang, which are incorporated herein by reference. After plasma etching, remnant resist on the chuck 20 can etched by a wet chemical or dry etching method, as previously described. Plasma etching can also be used to deepen the grooves 80 formed on a patterned second electrode 24, as described above, when deeper grooves 80 are desirable. A groove pattern can also be etched on the bottom surface 28 of the chuck 20, so that the bottom surface 28 can be cooled by helium held in the grooves 80.

After forming the electrodes 22, 24 and insulator 26 on the chuck 20, the first and second holes 84, 86, and the coolant hole 82 are etched through the insulative layers 26b, 26c from the bottom surface 28 of the chuck 20, to provide apertures for insertion of the first and second studs 90a, 90b, and to provide a passage for the flow of coolant gas to the grooves 80. The coolant hole 82 is etched through the entire chuck 20. The first hole 84 is etched through only the lower insulative layer 26c to expose the first electrode 22. The second hole 86 is etched by etching through the lower insulative layer 26c, the lower electrode 24 and the insulative layer 26b, until the second electrode 24 is exposed. Preferably, the portions of the holes 84, and 86 through the insulative layers 26a, 26b, and 26c are etching using a laser etching process, such as those generally described in U.S. Pat. No. 5,221,426, to Tessier, et al.; U.S. Pat. No. 5,185, 295, to Goto; U.S. Pat. No. 4,236,296, to Woolhouse; and U.S. Pat. Nos. 4,388,517 and 4,448,636, to Schulte, et al.—all of which are incorporated herein by reference. Preferably the portions of the holes 84 and 86 through the metal electrode layer are etched using conventional wet chemical etchants for metals. During the etching step, polyvinylchloride tape is wrapped around the top surface 30 of the chuck 20 to protect the chuck 20.

After the holes 84 and 86 are etched, the first and second studs 90a, 90b are inserted through the holes 84, 86 in the chuck 20 and adhered to the first and second electrodes 22, 24, respectively, using an electrically conductive adhesive. The studs 90a, 90b have a shape and size suitable for insertion into the holes 84, 86 and for connecting the electrodes 22, 24 to the circuits 46 and 48, respectively.

The springs 92a, 92b and the contact pads 94a, 94b are then adhered to one another and to the support 44, using electrically conductive adhesive, to complete fabrication of the chuck 20.

Although the present invention has been described in considerable detail with reference to certain preferred versions, many other versions should be apparent to those skilled in the art. For example, both the first and second electrodes 22, 24 can be patterned. Also, the insulative layers 26a, 26b, and 26c can be non-continuous layers, and not continuous layers as described and shown herein. Therefore, the spirit and scope of the appended claims should not be limited to the description of the preferred versions contained herein.

What is claimed is:

1. An electrostatic chuck for holding a substrate on a support in a process chamber, the chuck comprising:

(a) first and second electrodes;

(b) a continuous insulator having (i) a lower portion below the first electrode, the lower portion having a bottom surface suitable for resting on the support of the process chamber, (ii) a middle portion between the first and second electrodes, the middle portion being formed of a dielectric material, having a sufficiently elevated dielectric breakdown strength to substantially prevent the flow of electrons between the first and second electrodes, and (iii) an upper portion on the second electrode, the upper portion having a top surface suitable for holding a substrate thereon, wherein, when the chuck is placed on a support in a process chamber, and a first voltage is applied to the first electrode, a first electrostatic force holds the chuck onto the support, and wherein, when a substrate is placed on the top surface of the chuck, and a second voltage is applied to the second electrode, a second electrostatic force holds the substrate to the chuck.

2. The chuck of claim 1, wherein at least one surface of the insulator has spaced apart grooves therein, the grooves sized and distributed for holding a coolant for cooling the substrate on the chuck.

3. The chuck of claim 1, wherein the insulator has a resistivity of from about $10^{13}$ Ω cm to $10^{20}$ Ω cm.

4. The chuck of claim 1, wherein the first electrode comprises a unipolar electrode.

5. The chuck of claim 1, wherein the first electrode comprises a bipolar electrode.

6. The chuck of claim 5, wherein the first bipolar electrode comprises a pair of electrodes, and wherein, the first voltage maintains the pair of electrodes at opposing electrical polarities.

7. The chuck of claim 1, wherein the thicknesses of the lower, middle, and upper portions of the insulator are each from about 1 to about 100 μm.

8. The chuck of claim 1, wherein the chuck has a right cylindrical shape with a diameter of from about 100 mm to about 300 mm.

9. The chuck of claim 7, wherein the first and second electrodes are substantially planar.

10. The chuck of claim 1, wherein the chuck comprises disengageable electrical connector assemblies for electrically connecting the first and second electrodes to the first and second voltage sources.

11. The chuck of claim 10, wherein the disengageable electrical connector assemblies each comprise a rigid electrical connector and a resilient electrical connector.

12. The chuck of claim 11, wherein the rigid electrical connector is mounted on the chuck and is electrically connected to an electrode, and wherein the resilient electrical connector is mounted on the support in the chamber and is electrically connected to a voltage source; and wherein when the chuck is placed on the support, the rigid connector contacts the resilient connector, thereby electrically connecting the electrode to the voltage source.

13. The chuck of claim 12, wherein the resilient electrical connector comprises a flexible tab having a first portion mounted on the support and electrically connected to the voltage source, and a second portion adapted to resiliently and electrically contact the rigid electrical connector.

14. The chuck of claim 10, wherein the disengageable electrical connector assemblies each comprise a rigid electrical connector and a resilient electrical connector.

15. The chuck of claim 12, wherein the resilient electrical connector comprises:

(a) an electrically conductive spring mounted on the support in the chamber, and (b) an electrically conductive contact pad on the spring.

16. The chuck of claim 1, wherein the chuck comprises disengageable electrical connector assemblies for electrically connecting the first and second electrodes to the voltage sources.

17. The chuck of claim 1, wherein the continuous insulator comprises alumina.

18. An electrostatic chuck for holding a substrate on a support in a process chamber, the chuck comprising:

(a) a continuous insulator having spaced apart, first and second electrodes embedded therein, the insulator having a bottom surface suitable for resting on the support of the process chamber, and a top surface suitable for holding a substrate thereon; and (b) disengageable electrical connectors electrically connected to the first and second electrodes in the insulator, for connecting the electrodes to voltage sources, wherein, when the chuck is placed on a support in a process chamber, and the first electrode is electrically biased with respect to the support, a first electrostatic force holds the chuck onto the support, and wherein, when a substrate is placed on the top surface of the chuck, and the second electrode is electrically biased with respect to the substrate, a second electrostatic force holds the substrate to the chuck.

19. The chuck of claim 18, wherein the continuous insulator comprises alumina.

20. The chuck of claim 18, wherein each of the disengageable electrical connectors comprise a rigid electrical connector and a resilient electrical connector.

21. The chuck of claim 20, wherein the rigid electrical connector is mounted on the chuck and is electrically connected to an electrode, and wherein the resilient electrical connector is mounted on the support in the chamber and is electrically connected to a voltage source; and wherein when the chuck is placed on the support, the rigid connector contacts the resilient connector, thereby electrically connecting the electrode to the voltage source.

22. The chuck of claim 21, wherein the resilient electrical connector comprises a flexible tab having a first portion mounted on the support and electrically connected to the voltage source, and a second portion adapted to resiliently and electrically contact the rigid electrical connector.

23. A process chamber for processing a substrate, the process chamber comprising:

(a) a support having an electrically conductive portion; and (b) a chuck on the support, the chuck having (i) a first electrode for electrostatically holding the chuck to the support, (ii) a second electrode for electrostatically holding a substrate to the chuck, and (iii) a continuous insulator between the first and second electrodes, the insulator having a thickness and dielectric breakdown strength that are selected to substantially prevent the flow of electrons from the first electrode to the second electrode.

24. The process chamber of claim 23, wherein the chuck further comprises an insulator having (1) a lower portion under the first electrode, the lower portion having a bottom surface suitable for resting on the support of the process chamber, (2) a middle portion between the first and second electrodes; and (3) an upper portion on the second electrode, the upper portion having a top surface suitable for holding the substrate thereon, wherein, the chuck is electrostatically held to the support by applying a first voltage to the first electrode, and wherein, the substrate is electrostatically held to the chuck by applying a second voltage to the second.

25. The process chamber of claim 24, wherein at least one surface of the insulator on the chuck has spaced apart grooves therein, the grooves sized and distributed for holding a coolant for cooling the chuck.

26. The process chamber of claim 24, wherein the insulator has a resistivity of from about $10^{13}$ Ω cm to $10^{20}$ Ω cm.

27. The process chamber of claim 24, wherein the chuck has a right cylindrical shape with a diameter of from about 100 mm to about 300 mm.

28. The process chamber of claim 24, wherein the chuck comprises disengageable electrical connectors capable of electrically connecting the first and second electrodes to voltage sources.

29. The process chamber of claim 23, wherein the continuous insulator of the chuck comprises alumina.

30. A method of using a multi-electrode chuck comprising the steps of:
  (a) placing the multi-electrode chuck of claim 1 on a support in a process chamber;
  (b) placing a substrate on the chuck;
  (c) applying a first voltage to the first electrode to generate a first electrostatic force between the electrode and the support, that holds the chuck onto the support, and
  (d) applying a second voltage to the second electrode to generate a second electrostatic force between the electrode and the substrate, that holds the substrate to the chuck.

31. The method of claim 30, wherein at least one surface of the insulator of the chuck has spaced apart grooves therein, and wherein the method further comprises the step of maintaining a coolant in the grooves for cooling the chuck.

32. The method of claim 30, comprising the step of electrically connecting the electrodes in the chuck to voltage sources using disengageable electrical connectors.

33. A rapidly-demountable electrostatic chuck for use with sources of voltage for holding a substrate on a support in a process chamber, the chuck comprising:
  (a) a continuous insulator having a first surface adapted to support a substrate thereon, and a generally-opposed second surface adapted to be received on the support in the process chamber;
  (b) spaced apart first and second electrodes in the insulator, the electrodes separated by an insulator layer having a thickness and dielectric breakdown strength that are selected to substantially prevent the flow of electrons from the first electrode to the second electrode; and
  (c) electrical connectors adapted to connect the first and second electrode structures to voltage sources so as to electrically bias the first electrode structure with respect to the support to generate a first electrostatic force holding the chuck to the support, and so as to electrically bias the second electrode structure with respect to a substrate overlying the chuck to generate a second electrostatic force holding the substrate to the chuck, whereby the chuck can be rapidly demounted from the support.

34. The electrostatic chuck of claim 33 in which the first electrode structure includes at least one pair of electrodes.

35. The electrostatic chuck of claim 34, in which each electrode of the pair is connected to a voltage source so as to maintain the pair of electrodes at opposite polarities.

36. The electrostatic chuck of claim 34, in which each electrode of the pair is connected to a voltage source so as to maintain the pair of electrodes at opposite polarities.

37. The electrostatic chuck of claim 33, in which the first electrode structure comprises a unitary planar conductive element.

38. The electrostatic chuck of claim 33, wherein the first electrode structure comprises a unitary planar conductive element, and wherein portion of the substrate which engages the second surface of the insulator is planar.

39. The chuck of claim 33, wherein the continuous insulator comprises alumina.

40. An electrostatic chuck for holding a substrate on a support in a process chamber, the chuck comprising:
  (a) a first electrode configured for electrostatically holding a substrate to the chuck when a first voltage is applied to the electrode;
  (b) a second electrode configured for electrostatically holding the chuck to the support in the process chamber when a second voltage is applied to the electrode; and
  (c) a continuous insulator between the first and second electrodes, the insulator having a thickness and dielectric breakdown strength that are selected to substantially prevent the flow of electrons between the first and second electrodes, without the use of a ground plane between the first and second electrodes.

41. The electrostatic chuck of claim 40, wherein the insulator comprises a surrounding portion that surrounds the first and second electrodes, thereby substantially electrically insulating the first and second electrodes.

42. The chuck of claim 40, wherein at least one surface of the insulator has spaced apart grooves therein, the grooves sized and distributed for holding a coolant for cooling the substrate held on the chuck.

43. The chuck of claim 40, wherein the portion of the insulator between the first and second electrodes is from about 1 to about 100 mm thick.

44. The chuck of claim 40, wherein the chuck comprises disengageable electrical connector assemblies for electrically connecting the first and second electrodes to voltage sources capable of supplying the first and second voltages to the electrodes.

45. The chuck of claim 40, wherein the continuous insulator comprises alumina.

* * * * *